(12) United States Patent
Gong et al.

(10) Patent No.: US 11,682,465 B2
(45) Date of Patent: Jun. 20, 2023

(54) RELIABLE THROUGH-SILICON VIAS

(71) Applicant: ATI Technologies ULC, Markham (CA)

(72) Inventors: Zheng Gong, Toronto (CA); Jiao Wang, Markham (CA); Zhenhua Yang, Markham (CA)

(73) Assignee: ATI Technologies ULC, Markham (CA)

( * ) Notice: Subject to any disclaimer, the term of this patent is extended or adjusted under 35 U.S.C. 154(b) by 0 days.

(21) Appl. No.: 17/491,164

(22) Filed: Sep. 30, 2021

(65) Prior Publication Data

US 2023/0102669 A1   Mar. 30, 2023

(51) Int. Cl.
| | | |
|---|---|---|
| *G11C 17/16* | (2006.01) | |
| *G11C 17/18* | (2006.01) | |
| *H01L 23/525* | (2006.01) | |
| *G11C 29/44* | (2006.01) | |
| *G11C 29/02* | (2006.01) | |
| *H01L 23/48* | (2006.01) | |
| *H10B 20/20* | (2023.01) | |

(52) U.S. Cl.
CPC ............. *G11C 17/16* (2013.01); *G11C 17/18* (2013.01); *G11C 29/027* (2013.01); *G11C 29/44* (2013.01); *H01L 23/481* (2013.01); *H01L 23/5256* (2013.01); *H10B 20/20* (2023.02)

(58) Field of Classification Search
CPC ....... G11C 17/16; G11C 17/18; G11C 29/027; G11C 29/44; H01L 23/481; H01L 23/5256; H01L 27/11206
USPC .................................................. 365/96, 225.7
See application file for complete search history.

(56) References Cited

U.S. PATENT DOCUMENTS

| | | | | |
|---|---|---|---|---|
| 9,966,318 | B1* | 5/2018 | Pagani ............... | G01R 31/2853 |
| 10,163,980 | B2* | 12/2018 | Lin ..................... | H01L 45/1641 |
| 10,170,398 | B2* | 1/2019 | Kang .................... | H01L 23/528 |
| 2003/0037277 | A1* | 2/2003 | Tamura ................. | G11C 29/78 |
| | | | | 714/5.1 |
| 2010/0078635 | A1* | 4/2010 | Kuroda ................. | G11C 29/02 |
| | | | | 438/107 |
| 2011/0080184 | A1* | 4/2011 | Wu ........................ | H01L 22/34 |
| | | | | 324/762.02 |
| 2011/0110064 | A1* | 5/2011 | Foster, Sr. ........... | H01L 25/0657 |
| | | | | 257/E23.174 |
| 2012/0182778 | A1* | 7/2012 | Sato ......................... | G11C 5/02 |
| | | | | 365/63 |
| 2014/0351783 | A1* | 11/2014 | Haridass ............ | G01R 31/31725 |
| | | | | 716/134 |
| 2014/0361410 | A1* | 12/2014 | Yamamichi ......... | H01L 25/0657 |
| | | | | 257/621 |
| 2015/0129978 | A1* | 5/2015 | Moon ................... | H01L 23/481 |
| | | | | 257/394 |

(Continued)

*Primary Examiner* — Michael T Tran
(74) *Attorney, Agent, or Firm* — Polansky & Associates, P.L.L.C.; Paul J. Polansky

(57) ABSTRACT

An integrated circuit includes a TSV extending from a first surface of a semiconductor substrate to a second surface of the semiconductor substrate and having a first end and a second end, and a non-volatile repair circuit. The non-volatile repair circuit includes a one-time programmable (OTP) element having a programming terminal, wherein in response to an application of a fuse voltage to the programming terminal, the OTP element electrically couples the first end of the TSV to the second end of the TSV.

20 Claims, 6 Drawing Sheets

(56) References Cited

U.S. PATENT DOCUMENTS

| | | | |
|---|---|---|---|
| 2016/0099230 A1* | 4/2016 | Kang | G01R 31/2856 |
| | | | 438/4 |
| 2017/0053716 A1* | 2/2017 | Kim | G11C 29/24 |
| 2017/0373040 A1* | 12/2017 | Pagani | H01L 22/22 |
| 2018/0226307 A1* | 8/2018 | Pagani | H01L 21/76898 |
| 2018/0350688 A1* | 12/2018 | Or-Bach | H01L 21/8238 |
| 2020/0227411 A1* | 7/2020 | Wang | H01L 27/11519 |
| 2020/0313074 A1* | 10/2020 | Smith | H01L 27/228 |
| 2021/0141944 A1* | 5/2021 | Meier | G06F 21/79 |
| 2021/0159163 A1* | 5/2021 | Liff | H01L 21/768 |
| 2021/0305255 A1* | 9/2021 | Alzate Vinasco | |
| | | | H01L 27/10888 |
| 2022/0113348 A1* | 4/2022 | Whetsel | G01R 31/318541 |
| 2022/0189913 A1* | 6/2022 | Atanasov | H01L 27/10808 |
| 2022/0199535 A1* | 6/2022 | Karhade | H01L 21/4853 |

\* cited by examiner

RELIABLE THROUGH-SILICON VIAS

BACKGROUND

Modern electronic systems based on integrated circuit (IC) technology require small size and need to operate at very high speeds with low power consumption. For some ICs, such as data processors for laptop and notebook applications or mobile phones, speeds in the giga-Hertz (GHz) range are required while power consumption must remain low. One of the techniques developed to meet these needs is known as three-dimensional (3D) integration, in which multiple ICs are stacked on top of each other and interconnected using through-silicon via (TSV) technology. TSVs extend from an active surface of an IC to an opposite surface, reducing the length of metal wires and lowering the parasitic resistance, capacitance, and interconnect resistance compared to two-dimensional (2D) designs, which results in a higher clock frequency capability and lower power dissipation However, TSVs are subject to various manufacturing defects. TSV defects such as pinholes in the silicon dioxide or opens/voids in the conductor can be introduced during the manufacturing process. If TSVs having these defects are used, then signal integrity could be undermined. Pinhole defects in the silicon dioxide will dramatically increase the leakage current from ports (TSV can be viewed as a two-port system) to ground, and may increase the cross-talk among TSV arrays. Air void defects reduce the conductivity of TSVs, which add signal propagation delays and limit the speed of operation. Open defects can block the signal entirely. While open faults can be readily detected, there are no known automated product testing techniques to detect pinhole defects or voids.

One known technique to compensate for these defects is to fabricate the IC with a redundancy TSV array and to substitute spare, defect-free TSVs for faulty TSVs. Using this technique, when faulty TSVs are detected, they are bypassed using spare TSVs in the redundancy array. However, there are drawbacks to this technique. First, it requires increased design and fabrication complexity for the redundancy TSV array and interconnect networks. Choosing the right number of TSVs in the redundant array is also problematic. If too few are provided, the risk of running out of spare TSVs increases. Too many spares, however, increases cost. Second, using the spare TSVs introduces increased signal propagation delay times due to the longer path and parasitic capacitance and resistance of the metal wires.

Figure 1:
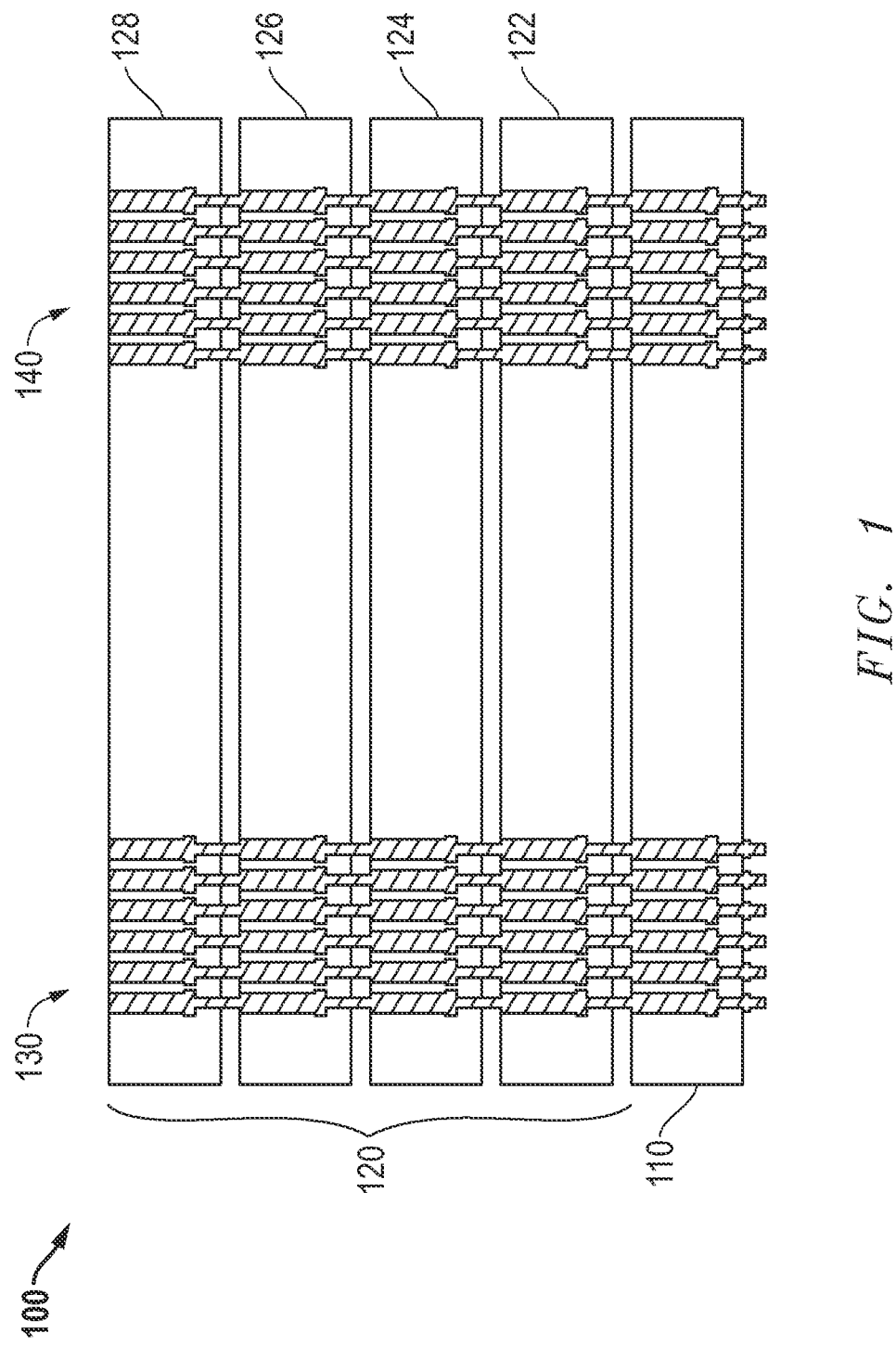
FIG. 1 illustrates a cross-section of an integrated circuit module using through-silicon vias (TSVs)

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

An integrated circuit includes a TSV extending from a first surface of a semiconductor substrate to a second surface of the semiconductor substrate and having a first end and a second end, and a non-volatile repair circuit. The non-volatile repair circuit includes a one-time programmable (OTP) element having a programming terminal, wherein in response to an application of a fuse voltage to the programming terminal, the OTP element electrically couples the first end of the TSV to the second end of the TSV.

A TSV fault detection and repair circuit includes a reference TSV, a first current mirror, a second current mirror, and a TSV under test. The reference TSV has a first end coupled to a first voltage terminal, and a second end. The first current mirror has an input coupled to the second end of the reference TSV, and an output. The second current mirror has an input coupled to the output of the first current mirror, and an output. The TSV under test has a first end coupled to the output of the second current mirror, and a second end selectively coupled to a second voltage terminal.

A method for fault detection and/or repair of a TSV of an integrated circuit includes generating a first current based on a reference current through a reference TSV. A second current proportional to the first current is provided to a first end of a TSV under test. A second end of the TSV under test is coupled to a first voltage terminal. A difference between the first current and the second current is measured. A fault in the TSV under test is detected if the difference exceeds a threshold.

FIG. 1 illustrates a cross-section of an integrated circuit module 100 using through-silicon vias (TSVs). In the example shown in FIG. 1, integrated circuit module 100 is formed as an integrated circuit die stack that includes an optional base die 110 and a set of bulk memory dies 120. Bulk memory dies 120 include dynamic random-access memory (DRAM) integrated circuit dies 122, 124, 126, and 128 physically overlying optional base die 110 and connected to it using die-to-die bonding technology. The die-to-die bonding technology includes hybrid bonding, thermocompression bonding, micro-bumping, die-to-wafer bonding, wafer-to-wafer bonding, and the like. With hybrid bonding technology, the circuitry formed in (for bulk semiconductor technologies) or on (for epitaxial deposition technologies) the semiconductor substrate is connected from the active surface to the opposite surface using through-silicon vias (TSVs). Using this technique, a landing pad on the active surface of a subsequent die in the die stack is electrically and mechanically connected to a corresponding TSV of a previous die. Die-to-die bonding provides low resistance inter-die interconnects and is shown graphically in FIG. 1 as memory channels 130 and 140.

Figure 2:
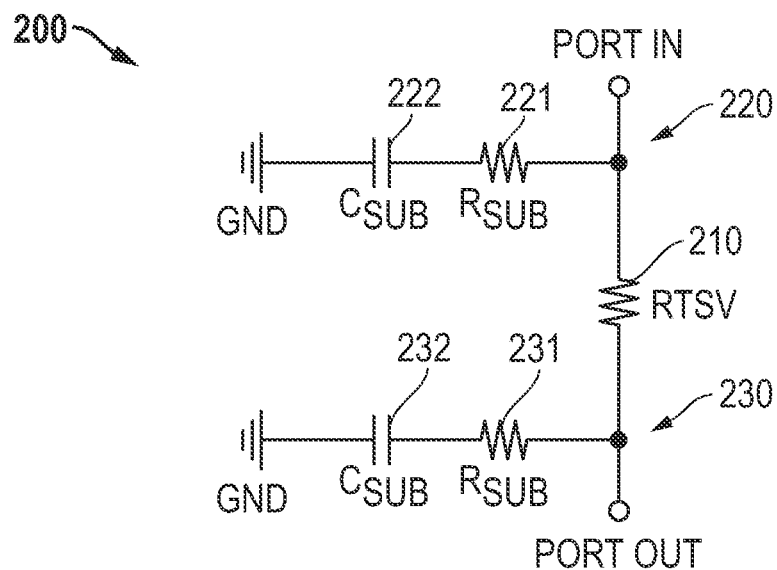
FIG. 2 illustrates in schematic form a circuit model of a fault-free TSV.

FIG. 2 illustrates in schematic form a circuit model 200 of a fault-free TSV. According circuit model 200, the fault-free TSV extends from a first surface of an integrated circuit die labeled "PORT IN" to a second surface of the integrated circuit die labelled "PORT OUT" and adds a relatively low resistance labelled "RTSV" between PORT IN and PORT OUT. The TSV also has a parasitic path 220 from PORT IN to ground and a parasitic path 230 from PORT OUT to ground. Parasitic path 220 is modeled as a series combination of resistor 221 and a capacitor 222 from PORT IN to ground. Likewise, parasitic path 230 is modeled as a series combination of resistor 231 and a capacitor 232 from PORT IN to ground. In a fault-free TSV, the series resistance RTSV is relatively small and the parasitic resistances $R_{SUB}$ and are relatively large and balanced so that the fault-free TSV is able to conduct signals between PORT IN and PORT OUT at high speeds.

Figure 3:
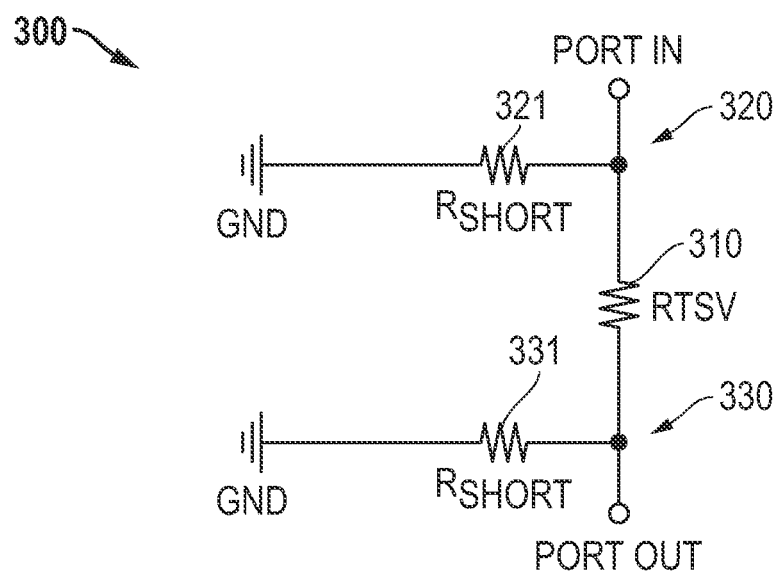
FIG. 3 illustrates in schematic form a circuit model of a TSV with a pinhole defect.

FIG. 3 illustrates in schematic form a circuit model 300 of a TSV with a pinhole defect. According to circuit model 300, the TSV extends from the first surface of the integrated circuit die, PORT IN, to the second surface of the integrated circuit die, PORT OUT, again adding a relatively low resistance RTSV between PORT IN and PORT OUT. However, the relatively large resistances in the parasitic paths to ground, paths 320 and 330, are now modeled by relatively small resistances 321 and 331 each shown in FIG. 3 as having resistances labelled "$R_{SHORT}$" caused by the pinholes. These small resistances cause significant leakage current directly to ground, which compromises the integrity of the electrical signals through the TSV.

Figure 4:
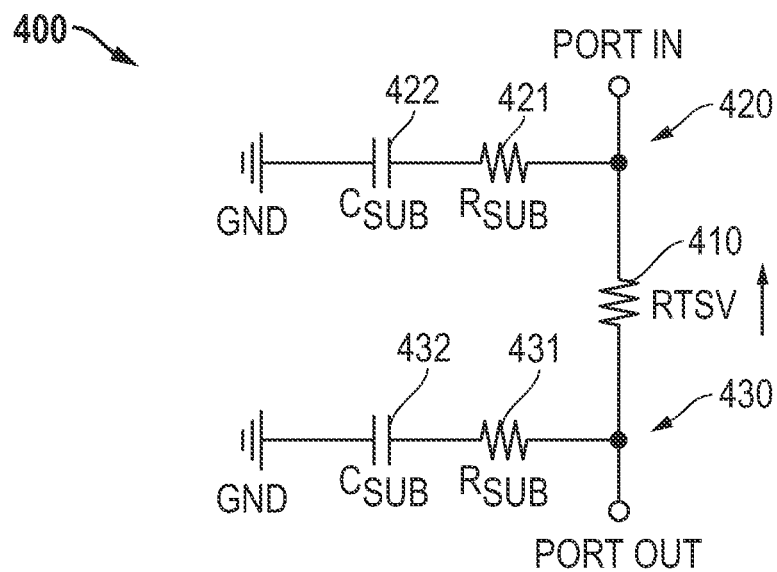
FIG. 4 illustrates in schematic form a circuit model of a TSV with air void defects.

FIG. 4 illustrates in schematic form a circuit model 400 of a TSV with an air void defect. According to circuit model 400, the TSV extends from the first surface of the integrated circuit die, PORT IN, to the second surface of the integrated circuit die, PORT OUT, and has a parasitic path 420 from PORT IN to ground and a parasitic path 430 from PORT OUT to ground. Parasitic path 420 is modeled as a series combination of resistor 421 and a capacitor 422 from PORT IN to ground. Likewise, parasitic path 430 is modeled as a series combination of resistor 431 and a capacitor 432 from PORT IN to ground. In circuit model 400, the parasitic resistances $R_{SUB}$ are relatively large and balanced. However, with aid voids, resistor 410 has a resistance RTSV that is significantly larger than the resistance of a defect-free TSV, so that the TSV is unable to conduct signals between PORT IN and PORT OUT at high speeds.

Figure 5:
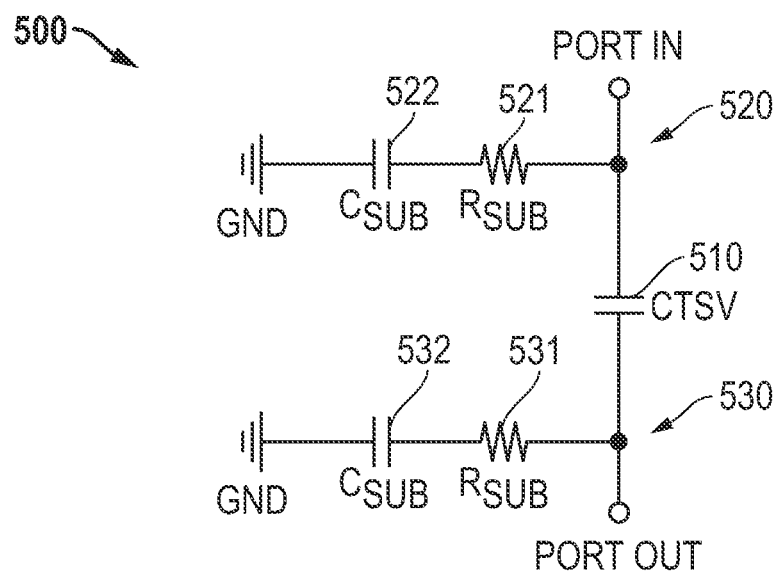
FIG. 5 illustrates in schematic form a circuit model of a TSV with an open defect.

FIG. 5 illustrates in schematic form a circuit model 500 of a TSV with an open defect. According to circuit model 500, the TSV extends from the first surface of the integrated circuit die, PORT IN, to the second surface of the integrated circuit die, PORT OUT, and has a parasitic path 520 from PORT IN to ground and a parasitic path 530 from PORT OUT to ground. Parasitic path 520 is modeled as a series combination of resistor 521 and a capacitor 522 from PORT IN to ground. Likewise, parasitic path 530 is modeled as a series combination of resistor 531 and a capacitor 532 from PORT IN to ground. In circuit model 500, the parasitic resistances $R_{SUB}$ are relatively large and balanced. However, with an open defect, such as when the sizes of air voids are large enough, the electrical connection between PORT IN and PORT OUT is effectively cut, and the relatively small resistance is replaced with a capacitance CTSV.

Figure 6:
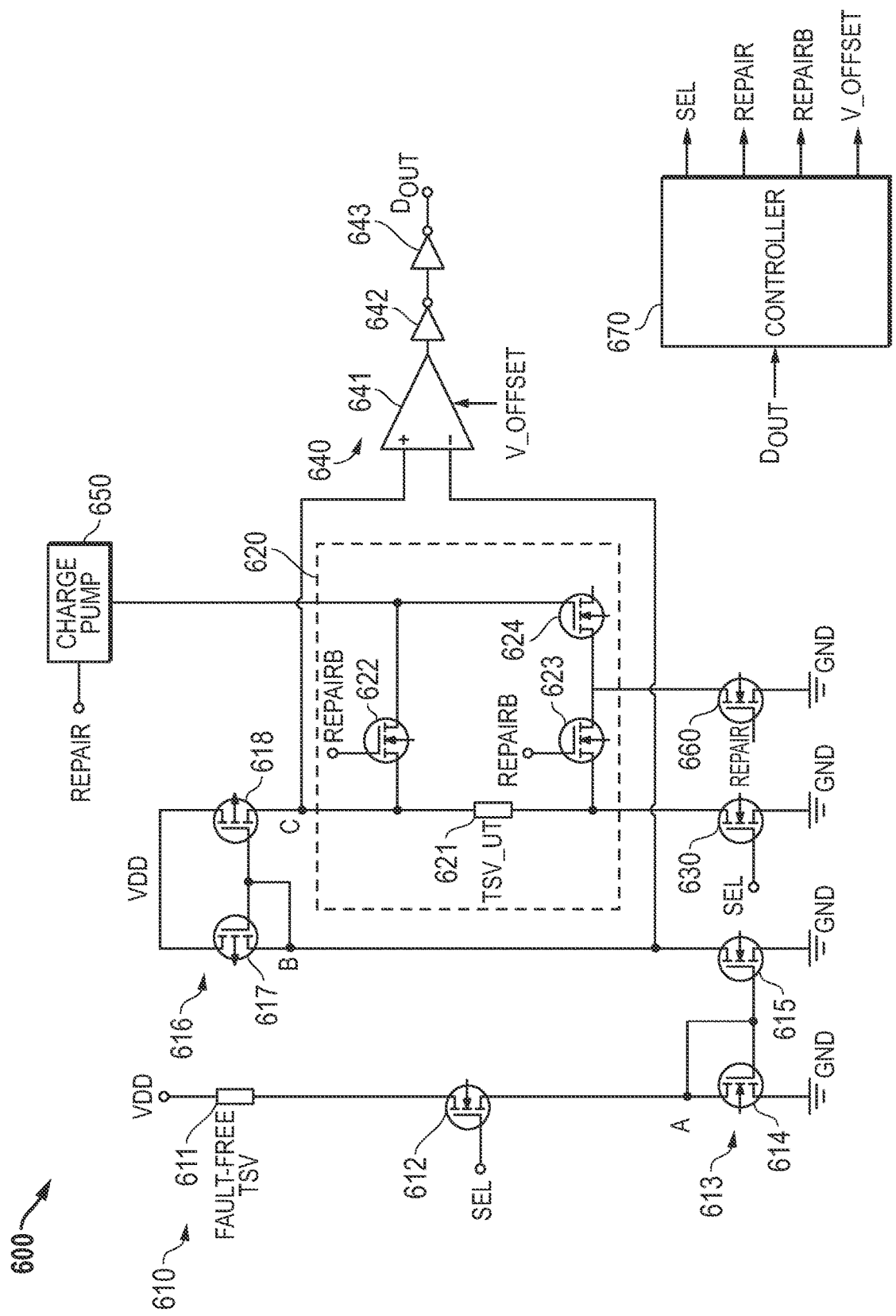
FIG. 6 illustrates in schematic form a test and repair circuit for a TSV under test according to some embodiments.

FIG. 6 illustrates in schematic form a test and repair circuit 600 for a TSV under test according to some embodiments. Test and repair circuit 600 includes generally a current mirror circuit 610, a TSV cell 620, a test select transistor 630, a comparison circuit 640, a charge pump 650, a repair select transistor 660, and a controller 670.

Current mirror circuit 610 includes a reference TSV 611, a test select transistor 612, a first current mirror 613, and a second current mirror 616. Reference TSV 611 is known to be fault free and has a first end at a first surface of the integrated circuit connected to VDD, and a second end at a second surface of the integrated circuit. Test select transistor 612 is an N-channel metal-oxide-semiconductor (MOS) transistor having a drain connected to the second end of reference TSV 611, a gate for receiving a select signal labelled "SEL", and a source connected to a node labelled "A".

First current mirror 613 includes transistors 614 and 615. Transistor 614 is an N-channel MOS transistor having a drain connected to the source of transistor 612 at node A, a gate connected to the drain thereof, and a source connected to ground. Transistor 615 is an N-channel MOS transistor having a drain connected to a node labelled "B", a gate connected to the drain and gate of transistor 614, and a source connected to ground.

Second current mirror 616 includes transistors 617 and 618. Transistor 617 is a P-channel MOS transistor having a source connected to VDD, a gate, and a drain connected to the gate thereof and to the drain of transistor 615 at node B. Transistor 618 is a P-channel MOS transistor having a source connected to VDD, a gate connected to the drain of transistor 617, and a drain connected to a node labelled "C".

TSV cell 620 includes a TSV 621 labelled "TSV_UT", a repair transistor 622, a repair transistor 623, and a transistor 624. TSV 621 has a first end on a first surface of the integrated circuit substrate connected to node C, and a second end on a second surface of the integrated circuit substrate. Repair transistor 622 is an N-channel MOS transistor having a first source/drain terminal connected to node C, a gate for receiving a complement of a repair signal labelled "REPAIRB", and a second source/drain terminal. Repair transistor 623 is an N-channel MOS transistor having a first source/drain terminal connected to the second end of TSV 621, a gate for receiving the REPAIRB signal, and a second source/drain terminal. Transistor 624 is a fusible element implemented as an N-channel MOS transistor having a drain, a gate connected to the second source/drain terminal of repair transistor 622, and a source connected to the second source/drain terminal of repair transistor 623. Since the node C side of TSV 621 is at the active surface of the semiconductor die, repair transistors 623 and 624 are implemented as vertical transistors in which the drain, gate, and source (in the case of repair transistor 623) and the gate and source (in the case of transistor 624) extend vertically from the top surface of the substrate to the bottom surface of the semiconductor die. In this case, the drain, gate, and source connections are made at the top surface using conductive N+ (drain and source) and P+ (gate) diffusions.

Test select transistor 630 is an N-channel MOS transistor having a drain connected to the second end of TSV 621 and the first source/drain terminal of repair transistor 623, a gate for receiving the SEL signal, and a source connected to ground.

Comparison circuit 640 includes a comparator 641 and inverters 642 and 643. Comparator 641 has a positive input connected to node C, a negative input connected to node B, an offset voltage input for receiving a signal labelled "V_OFFSET", and an output. Inverter 642 has an input connected to the output of comparator 641, and an output.

Inverter 643 has an input connected to the output of inverter 642, and an output for providing a digital output signal labelled "$D_{OUT}$".

Charge pump 650 is a voltage generating circuit having an input for receiving the REPAIR signal, and an output connected to the second source/drain terminal of repair transistor 622 and to the gate of transistor 624.

Repair select transistor 660 is an N-channel MOS transistor having a drain connected to the second source/drain terminal of repair transistor 623 and to the source of transistor 624, a gate for receiving the REPAIR signal, and a source connected to ground.

Controller 670 has an input for receiving the $D_{OUT}$ signal, an output connected to the gates of test select transistors 612 and 630 for providing the SEL signal, an output connected to the input of charge pump 650 and to the gate of repair select transistor 660 for providing the REPAIR signal, an output connected to the gates of repair transistor 622 and repair transistor 623 for providing the REPAIRB signal, and an output connected to the offset voltage input of comparator 641 for providing the V_OFFSET voltage.

indicates that TSV 621 is fault free. In the test mode, controller 670 sets V_OFFSET to both a relatively small positive voltage, i.e., +V_RES, or a relatively small negative voltage, i.e., −V_RES, and determines the logic state of $V_{OUT}$. Since $R_{TSV\_UT}$ can be either slightly higher or slightly lower than RFAULT_FREE, controller 670 detects the fault-free condition when Dour changes logic state when V_OFFSET=+V_RES and V_OFFSET=−V_RES, regardless of which condition results in $D_{OUT}$ being a 1 and which condition results in $D_{OUT}$ being a 0.

If TSV 621 has an open fault or a void fault, then $R_{TSV\_UT} \gg R_{FAULT\_FREE}$ and in test mode $V_C \gg V_B$. Thus $D_{OUT}$ will be 0 regardless of whether V_OFFSET=+V_RES or V_OFFSET=−V_RES.

If TSV 621 has a pinhole fault, then $R_{TSV\_UT} \ll R_{FAULT\_FREE}$ and in test mode $V_C \ll V_B$. Thus $D_{OUT}$ will be 1 regardless of whether V_OFFSET=+V_RES or V_OFFSET=−V_RES.

TABLE I summarizes the test results and the condition indicated by the logic states of $D_{OUT}$ when V_OFFSET=+V_RES and V_OFFSET=−V_RES:

TABLE I

| Case | Fault Type | Voltage Configuration | Voltage Comparison | Resistance | $D_{OUT}$ |
|---|---|---|---|---|---|
| 1 | Fault free | V_OFFSET = +V_RES<br>V_OFFSET = −V_RES | VB − V_RES < VC <<br>VB + V_RES | R_Fault_Free − R_RES < R_UT<br>< R_FAULT_FREE + R_RES | 1<br>0 |
| 2 | Fault free | V_OFFSET = +V_RES<br>V_OFFSET = −V_RES | VB − V_RES < VC <<br>VB + V_RES | R_Fault_Free − R_RES < R_UT<br>< R_FAULT_FREE + R_RES | 0<br>1 |
| 3 | Open, Void | V_OFFSET = +V_RES<br>V_OFFSET = −V_RES | VC > VB + V_RES | R_UT > R_Fault_Free + R_Res | 0<br>0 |
| 4 | Pin-hole | V_OFFSET = +V_RES<br>V_OFFSET = −V_RES | VC < VB − V_RES | R_UT < R_Fault_Free + R_Res | 1<br>1 |

In operation, TSV test and repair circuit 600 utilizes a current based sense amplifier to detect TSV faults, and can detect not only open defects, but also air voids and pinhole defects, based on different equivalent resistances between port IN and port OUT. Because the current mirror discharges quickly, the disclosed testing circuit provides fast testing speed. TSV test and repair circuit 600 operates in one of a test mode, a repair mode, and a normal operation mode.

In the test mode, the SEL signal is active, and the REPAIR and REPAIRB signals are inactive. Test select transistors 612 and 630 are conductive, and a current $I_A$, which flows through reference TSV 611 and transistor 612 and into the input of first current mirror 613. First current mirror 613 mirrors current $I_A$ to form a current $I_B$, which flows into the input of second current mirror 616. Second current mirror 616 mirrors current $I_B$ to form a current $I_C$, which flows through TSV 621, the TSV under test. If the resistance of TSV 621, $R_{TSV\_UT}$, is larger than the resistance of reference TSV 611, $R_{FAULT\_FREE}$, then the voltage at node C, $V_C$, will be greater than $V_B$. If $R_{TSV\_UT}$ is smaller than $R_{FAULT\_FREE}$, then $V_C$, will be less than $V_B$.

Controller 670 detects all known types of TSV faults in test mode. In particular, controller 670 provides a selectable offset voltage, V_OFFSET, to an input to comparator 641 to detect whether the TSV under test is fault free, has an open fault, has a void fault, or has a pinhole fault. Controller 670 uses current mirror circuit 610 and two values of V_OFFSET, +V_RES and −V_RES, to make this determination.

If TSV 621 is fault-free, then its resistance will be approximately equal to the resistance of a known fault-free TSV, i.e., reference TSV 611. Controller 670 thus determines whether VC is approximately equal to VB, which After executing the test mode and determining whether the TSV under test is fault-free or has an open fault, a void fault, or a pinhole fault, controller then enters repair mode.

In repair mode, controller 670 activates the REPAIR signal at a logic high, and deactivates the REPAIRB at a logic low. Repair transistor 622 and repair transistor 623 are nonconductive, and repair select transistor 660 is conductive. Charge pump 650 is active and provides a voltage on the gate of transistor 624 that is large enough to break down the gate oxide of transistor 624, creating a low resistance path between the gate and the source of transistor 624. At the end of repair mode, the resistance from the first end of TSV 621 to the second end of TSV 621 is equal to the parallel combination of $R_{TSV\_UT}$ and the gate-to-source resistance through the oxide of transistor 624.

Existing methods of TSV repair have higher interconnection density and logic design complexity because they focus on implementing redundancy TSV arrays that require extensive signal re-routing. The long metal wires for the logic design create large parasitic capacitances and resistances, which increase the delays when signals are propagating through TSV redundancy arrays. On the other hand, the disclosed TSV cell allows faulty TSVs to be repaired on-chip using one-time programmable (OTP) fuse cells. For example, once a TSV with air voids or open defects is detected, controller 670 activates charge pump 650 blows to blow the OTP fuse cell.

In the illustrated embodiment, the OTP fuse cell is a MOS transistor in which the fuse voltage ruptures the gate oxide and creates a high conduction path between the gate terminal of the source terminal, thereby bypassing the faulty fuse and reconnecting the IN and OUT ports. The disclosed TSV test and repair circuit and method does not need a redundancy TSV array, complicated logic design, or longer metal wires, and integrated circuits can be made with this technique using currently-existing semiconductor manufacturing processes. Once the TSV fault is detected, the charge pump breaks down the OTP transistor's silicon dioxide, converting the gate-to-source resistance from the multi-megohm range to close to the TSV's resistance.

In normal operation mode, controller 670 keeps the SEL signal, the REPAIR signal, and the REPAIRB signal in their respective inactive states. The resistance between the input port and the output port of TSV cell 620 is equal to either $R_{TSV\_UT}$ alone if no open or void fault was detected, or the parallel combination of $R_{TSV\_UT}$ and the gate-to-source resistance through the oxide of transistor 624 if an open or void fault was detected.

Figure 7:
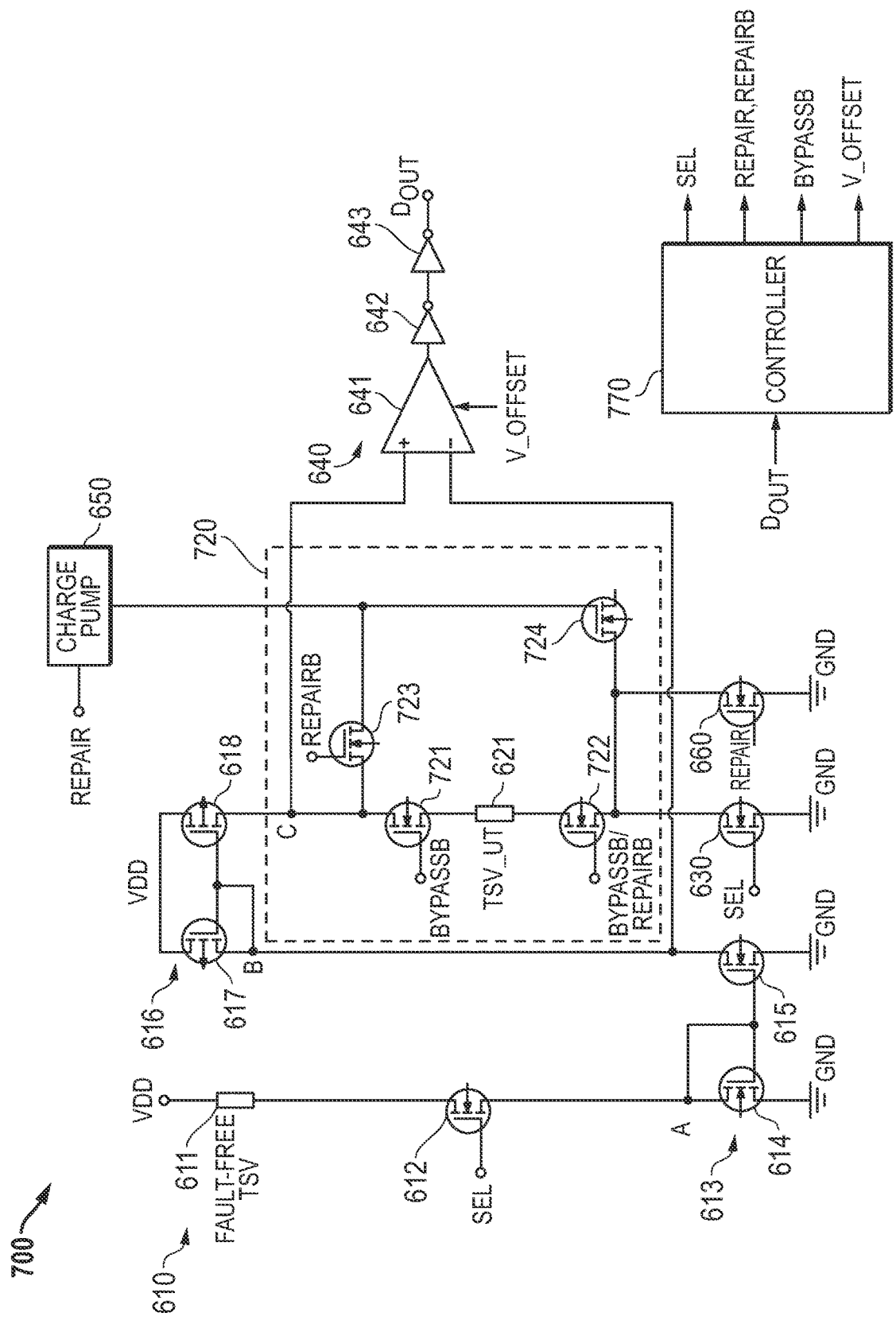
FIG. 7 illustrates in schematic form a test and repair circuit for a TSV under test according to some embodiments.

FIG. 7 illustrates in schematic form a test and repair circuit 700 for a TSV under test according to some embodiments. Test and repair circuit 700 is similar to test and repair circuit 600, and includes current mirror circuit 610, test select transistor 630, comparison circuit 640, charge pump 650, and repair select transistor 660 as previously described with respect to test and repair circuit 600. However, test and repair circuit 700 uses a TSV cell 720 different from TSV cell 620 to allow for the repair of a TSV with pinhole faults, and implements a controller 770 different from controller 670 with an extra control signal to accommodate this added functionality.

TSV cell 720 includes TSV 621 as in TSV cell 620, a bypass transistor 721, a bypass and repair transistor 722, a repair transistor 723, and a transistor 624. TSV 621 has a first end on a first surface of the integrated circuit substrate connected to node C, and a second end on a second surface of the integrated circuit substrate. Bypass transistor 721 is an N-channel MOS transistor having a first source/drain terminal connected to node C, a gate for receiving a complement of a bypass signal labelled "BYPASSB", and a second source/drain terminal. Bypass and repair transistor 722 is an N-channel MOS transistor having a first source/drain terminal connected to the second end of TSV 621, a gate for receiving a signal labelled "BYPASSB/REPAIRB", and a second source/drain terminal connected to the drain of test select transistor 630. Repair transistor 723 has a first source/drain terminal connected to the first source/drain terminal of bypass transistor 721, a gate for receiving the REPAIRB signal, and a second source/drain terminal connected to the output of charge pump 650. Transistor 724 is a fusible element implemented as an N-channel MOS transistor having a drain, a gate connected to the second source/drain terminal of repair transistor 723 and to the output of charge pump 650, and a source connected to the second source/drain terminal of bypass and repair transistor 722 and to the drains of transistors 630 and 660.

In the test mode, test and repair circuit 700 operates much the same as test and repair circuit 600 of FIG. 6. The BYPASSB signal is inactive at a logic high, making bypass transistor 721 and bypass and repair transistor 722 conductive. The REPAIRB signal is also inactive at a logic high, but while repair transistor 723 is conductive, the output of charge pump 650 is inactive so that the voltage on the gate of transistor 724 is zero and the gate-to-source voltage of transistor 724 is below the oxide breakdown voltage. Signal SEL is active at a logic high, making transistor 630 conductive and allowing the mirrored current to flow through transistor 618 and TSV 621. Controller 770 controls the application of the V_OFFSET voltage to test whether TSV 621 is fault-free, or has an open fault, a void fault, or a pinhole fault as described with respect to TABLE I above.

In the repair mode, signal REPAIRB is active at a logic low, making bypass and repair transistor 722 and repair transistor 723 non-conductive. Signal REPAIR is active at a logic high, making repair select transistor 660 conductive and activating charge pump 650. Signal SEL is inactive at a logic low, keeping transistor 630 non-conductive.

In normal operation mode, signal REPAIR is inactive at a logic low, keeping charge pump 650 and repair select transistor 660 conductive. Signal REPAIRB is inactive at a logic high, making repair transistor 723 conductive. Signal SEL is active at a logic high, making transistor 630 conductive.

If controller 770 does not detect a fault, then signal BYPASSB is inactive at a logic high, and bypass transistor 721 and bypass and repair transistor 722 are conductive. Repair transistor 723 is also conductive, but since the fusible element, i.e., transistor 724, is not blown, TSV 621 alone connects the first landing pad to the second landing pad.

If controller 770 detects a fault that it not a pinhole fault, i.e., an open or void fault, then signal BYPASSB is inactive at a logic low, making bypass transistor 721 and bypass and repair transistor 722 conductive. Since the fusible element, i.e., transistor 724, is not blown, TSV 621 is in parallel with repair transistor 723 and the gate-to-source oxide of transistor 724, completing a parallel path that lowers the resistance from the first landing pad to the second landing pad as described above.

If controller 770 detects a pinhole fault, i.e., then signal BYPASSB is active at a logic low, making bypass transistor 721 and bypass and repair transistor 722 non-conductive, isolating the short to ground from the first and second landing pads. Since the fusible element, i.e., transistor 724, is blown, path through repair transistor 723 and the blown gate-to-source oxide of transistor 724 is formed between the first and second landing pads. Thus, TSV cell 720 adds the ability to correct for pinhole faults without large redundant TSV arrays and extra signal degradation due to the higher resistance through the longer on-die routing path.

Figure 8:
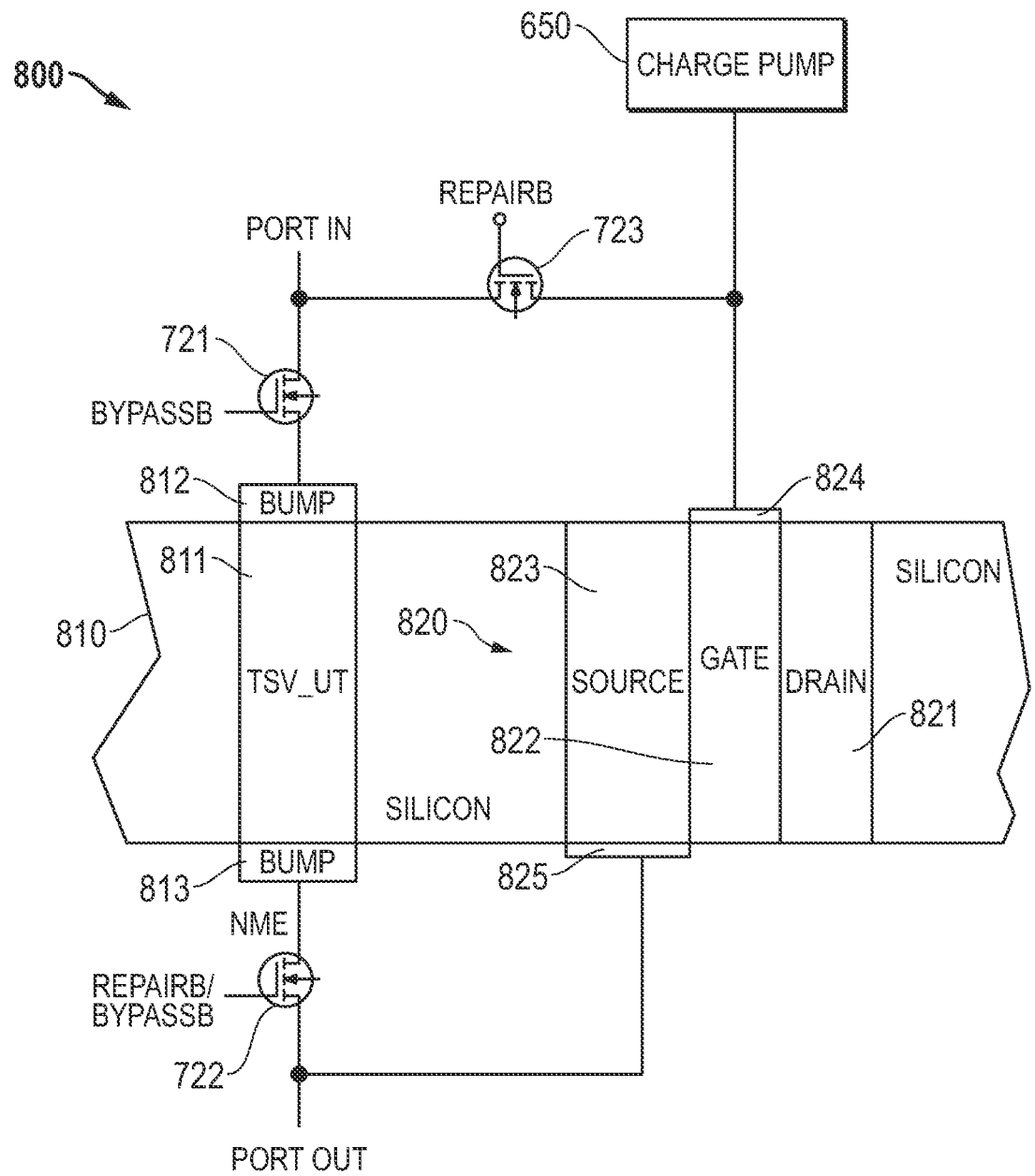
FIG. 8 shows a hybrid cross-section and circuit diagram of an integrated circuit with a TSV under test showing the structure of an associated OTP cell according to some embodiments.

FIG. 8 shows a hybrid cross-section and circuit diagram 800 of an integrated circuit 810 with a TSV under test 811 showing the structure of an associated OTP cell 820 according to some embodiments. In FIG. 8, charge pump 650, bypass transistors 721 and 722, and repair transistor 723 are shown connected to TSV 811 as previously illustrated. As oriented in FIG. 8, integrated circuit 810 has an active surface on a top side and an opposite surface on the bottom side. Transistor 820 has a drain region 821, a gate region 822, and a source region 823, each extending vertically from the top surface to the bottom surface. Drain region 821 is floating. Gate region 822 is connected to charge pump 750 through an integrated circuit landing pad 824. Source region 823 is floating at the top surface of integrated circuit 810, and is connected to an integrated circuit landing pad 825 that in a test mode may be connected to the source of repair and bypass transistor 722.

When it is determined that there is a fault, the controller (not shown again in FIG. 8) activates charge pump 650 to provide a programming voltage on gate terminal 822. The programming voltage is large enough to damage the gate-to-source junction so that it will become highly conductive. Landing pad 825 is connected to the PORT OUT terminal at the source of transistor 722 during test mode, but will be connected in parallel to TSV 811 in response to an open or void fault, and bypassed in response to a pinhole fault.

An integrated circuit containing the TSV cell with or without some or all of the test and repair circuit described above may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. In one example, the TSV test and repair circuitry disclosed above for use with TSV cell 620 may be located on the same integrated circuit as TSV cell 620, or it may be located partly or completely off-chip. Off-chip implementations include, for example, on a printed circuit board (PCB) or automated test equipment (ATE). The fault-free TSV may be on the same integrated circuit as the TSV under test to make sure that the TSVs are balanced. Also, the test and repair technique disclosed herein can be applied to a variety of types of integrated circuits, such as memories, logic devices, voltage regulators, and the like. Other types of fusible elements can also be used besides the gate-to-source path through the gate oxide of an MOS transistor disclosed above.

Accordingly, it is intended by the appended claims to cover all modifications of the disclosed embodiments that fall within the scope of the disclosed embodiments.

What is claimed is:

1. An integrated circuit comprising:
   a TSV extending from a first surface of a semiconductor substrate to a second surface of said semiconductor substrate and having a first end and a second end; and
   a non-volatile repair circuit comprising a one-time programmable (OTP) element having a programming terminal, wherein in response to an application of a fuse voltage to said programming terminal, said OTP element electrically coupling said first end of said TSV to said second end of said TSV.

2. The integrated circuit of claim 1, wherein OTP element comprises an MOS transistor having a gate coupled to a first end of said TSV, and a source/drain terminal coupled to said second end of said TSV.

3. The integrated circuit of claim 2, wherein said MOS transistor has a gate coupled to one of said first end and said second end of said TSV, and a source/drain terminal coupled to another one of said first end and said second end of said TSV.

4. The integrated circuit of claim 1, wherein said non-volatile repair circuit comprises:
   a first transistor having a first current electrode coupled to said first end of said TSV, a control electrode for receiving a complement of a repair signal, and a second current electrode;
   a second transistor having a first current electrode coupled to said second end of said TSV, a control electrode for receiving said complement of said repair signal, and a second current electrode;
   wherein said OTP element for couples said second current electrode of said first transistor to said second current electrode of said second transistor upon said application of said fuse voltage thereto; and
   a voltage generating circuit having an output coupled to said control electrode of said OTP element and responsive to said repair signal for providing said fuse voltage to said output thereof.

5. The integrated circuit of claim 4, further comprising:
   a test select transistor having a first current electrode coupled to said second end of said TSV, a control electrode for receiving a select signal, and a second current electrode coupled to a reference voltage terminal.

6. The integrated circuit of claim 1, wherein said non-volatile repair circuit comprises:
   a first transistor having a first current electrode coupled to a first landing pad on said first surface of the integrated circuit, a control electrode for receiving a complement of a bypass signal, and a second current electrode coupled to said first end of said TSV;
   a second transistor having a first current electrode coupled to said second end of said TSV, a control electrode for receiving a control signal that is active in response to an activation of either said complement of said bypass signal or a complement of a repair signal, and a second current electrode coupled to a second landing pad on said second surface of the integrated circuit; and
   a third transistor having a first current electrode coupled to said first landing pad, a control electrode for receiving said complement of said repair signal, and a second current electrode,
   wherein said OTP element couples said second current electrode of said third transistor to said second current electrode of said second transistor upon said application of said fuse voltage thereto.

7. The integrated circuit of claim 6, wherein said OTP element comprises an MOS transistor having a gate coupled to said second current electrode of said third transistor, and a source/drain terminal coupled to said second current electrode of said second transistor.

8. The integrated circuit of claim 6, further comprising:
   a voltage generating circuit having an output coupled to said control electrode of said OTP element and responsive to said repair signal for providing said fuse voltage to said output thereof; and
   a repair select transistor having a first current electrode coupled to said second current electrode of said second transistor, a control electrode for receiving said repair signal, and a second current electrode coupled to a reference voltage terminal.

9. A TSV fault detection and repair circuit comprising:
   a reference TSV having a first end coupled to a first voltage terminal, and a second end;
   a first current mirror having in input coupled to said second end of said reference TSV, and an output;
   a second current mirror having an input coupled to said output of said first current mirror, and an output; and
   a TSV under test having a first end coupled to said output of said second current mirror, and a second end selectively coupled to a second voltage terminal.

10. The TSV fault detection and repair circuit of claim 9, further comprising:

a first test select transistor coupled between said second end of said reference TSV and said input of said first current mirror and activated in response to a select signal; and a second test select transistor coupled between said second end of said TSV under test and said second voltage terminal and activated in response to said select signal.

11. The TSV fault detection and repair circuit of claim 10, wherein said reference TSV comprises a fault-free TSV.

12. The TSV fault detection and repair circuit of claim 11, further comprising:

a comparison circuit having a first input coupled to said output of said second current mirror, a second input coupled to said output of said first current mirror, and responsive to an offset voltage to provide a data signal to an output thereof that indicates said TSV has any one or more of an open fault, a pinhole fault, and a void fault.

13. The TSV fault detection and repair circuit of claim 12, further comprising:

a controller for activating said select signal and providing said offset voltage according to a type of fault to be detected in a test mode, and de-activating said select signal otherwise.

14. The TSV fault detection and repair circuit of claim 11, further comprising:

a voltage generating circuit responsive to a repair signal for providing a fuse voltage;

an OTP element selectively coupled in parallel to said TSV under test and having a control electrode for receiving said fuse voltage; and a repair select transistor having a first current electrode coupled to said OTP element, a control electrode for receiving said repair signal, and a second current electrode coupled to a reference voltage terminal.

15. The TSV fault detection and repair circuit of claim 14, further comprising:

a controller for generating control signals to decouple said OTP element from said TSV under test and activate said voltage generating circuit in a repair mode, and to couple said OTP element in parallel with said TSV under test and de-activate said repair signal otherwise.

16. The TSV fault detection and repair circuit of claim 15, wherein said voltage generating circuit comprises a charge pump.

17. A method for fault detection and/or repair of a TSV of an integrated circuit, comprising:

generating a first current based on a reference current through a reference TSV;

providing a second current proportional to said first current to a first end of a TSV under test;

coupling a second end of said TSV under test to a first voltage terminal;

measuring a difference between said first current and said second current; and detecting a fault in said TSV under test if said difference exceeds a threshold.

18. The method of claim 17, further comprising:

detecting one of an open fault and a void fault if said difference exceeds a positive threshold; and detecting a pinhole fault if said difference is less than a negative threshold.

19. The method of claim 18, further comprising repairing said TSV under test in response to detecting one of said open fault and said void fault, wherein said repairing comprises:

blowing an OTP element; and coupling said OTP element in parallel to said TSV under test.

20. The method of claim 18, further comprising repairing said TSV under test in response to detecting said pinhole fault, wherein said repairing comprises:

blowing an OTP element; and coupling said OTP element between a first landing pad and a second landing pad; and bypassing said TSV under test from said first landing pad and said second landing pad.

* * * * *